United States Patent
Wang et al.

(10) Patent No.: US 8,294,498 B2
(45) Date of Patent: Oct. 23, 2012

(54) CLOCK DE-SKEWING DELAY LOCKED LOOP CIRCUIT

(75) Inventors: Jinn-Shyan Wang, Chiayi (TW); Chun-Yuan Cheng, Yunlin County (TW); Chih-Chiang Liu, New Taipei (TW)

(73) Assignee: National Chung Cheng University, Chiayi County (TW)

( * ) Notice: Subject to any disclaimer, the term of this patent is extended or adjusted under 35 U.S.C. 154(b) by 0 days.

(21) Appl. No.: 13/158,697

(22) Filed: Jun. 13, 2011

(65) Prior Publication Data
US 2012/0112810 A1 May 10, 2012

(30) Foreign Application Priority Data

Nov. 5, 2010 (TW) .............................. 99138051 A (51) Int. Cl.
*H03L 7/06* (2006.01)

(52) U.S. Cl. ....................................... 327/158; 327/149

(58) Field of Classification Search .................. 327/149, 327/158
See application file for complete search history.

(56) References Cited

U.S. PATENT DOCUMENTS

| | | | |
|---|---|---|---|
| 6,141,292 A * | 10/2000 | Lee et al. ................. | 365/233.12 |
| 6,285,216 B1 * | 9/2001 | Faue et al. ...................... | 326/95 |
| 7,956,659 B2 * | 6/2011 | You et al. ...................... | 327/161 |
| 2004/0095174 A1 * | 5/2004 | Hong et al. .................... | 327/175 |
| 2005/0212575 A1 * | 9/2005 | Kim .............................. | 327/158 |
| 2006/0058976 A1 * | 3/2006 | Ferris ............................ | 702/123 |
| 2008/0136479 A1 * | 6/2008 | You et al. ...................... | 327/161 |
| 2010/0086075 A1 * | 4/2010 | Parikh et al. .................. | 375/267 |
| 2010/0117698 A1 * | 5/2010 | Millar ............................ | 327/158 |
| 2010/0156488 A1 * | 6/2010 | Kim et al. ..................... | 327/158 |
| 2012/0112810 A1 * | 5/2012 | Wang et al. ................... | 327/158 |

* cited by examiner

*Primary Examiner* — Lincoln Donovan
*Assistant Examiner* — Adam Houston
(74) *Attorney, Agent, or Firm* — Rosenberg, Klein & Lee (57) ABSTRACT

A clock de-skewing delay locked loop circuit is revealed. In the clock de-skewing delay locked loop circuit, a timing control circuit generates a first and a second clock signals according to an external and an internal clock signal. A clock delay line delays the first clock signal or the external clock signal to generate delay signals. A delay mirror circuit synchronizes the internal clock signal with the external clock signal. A phase adjustment circuit inverts the internal clock signal according to the phase difference. An inverting buffer circuit buffers the external clock signal or the first clock signal for adding an initial delay time so as to make a duty cycle of internal clock signal and of the external clock signal complement each other. Thus the duty cycle of the external clock signal in the proposed circuit is not necessarily 50%.

12 Claims, 10 Drawing Sheets

CLOCK DE-SKEWING DELAY LOCKED LOOP CIRCUIT

BACKGROUND OF THE INVENTION

1. Fields of the Invention

The present invention relates to a delay locked loop circuit, especially to a clock de-skewing delay locked loop circuit.

2. Descriptions of Related Art

The quality of clock signals is one of key factors that affect circuit performance. With the continuing advance of the semiconductor process technology, the demands of chip complexity and the frequency of clock signal has both grown recently. Therefore, the quality of the clock signals in chips is getting more important. Moreover, reducing the clock skew and clock jitter has become one of important issues in the high performance very large scale integrated circuit design or System-on-Chip (SOC) design. The improved clock signal quality not only increases system operating frequency but also reduces system failure rate. Otherwise, the reliability of the chip is further improved. Along this way, the delay-locked loops (DLLs) have been widely used in improving the quality of clock signals.

A plurality of new designs has been reported to improve the performance of DLLs and the clock signal quality. The DLL can be divided into two different architectures-open loop type and close loop type. The classical designs in the open loop type are Synchronous Mirror Delay (SMD) and Clock Synchronized Delay (CSD). Under the condition that the total delay time between the input clock buffer and the output clock buffer is smaller than input clock cycle, the open loop type circuit has the advantage of fast-locking capability (phase synchronization) within two external clock cycles. Due to fast phase locking, the open loop type circuits have been used in memory circuits. However, the open loop type circuit requires dummy delay lines and clock drivers so that it has high power consumption problem. Besides the power consumption, the mismatch between the delay lines also has effect on the circuit performance.

Figure 1:
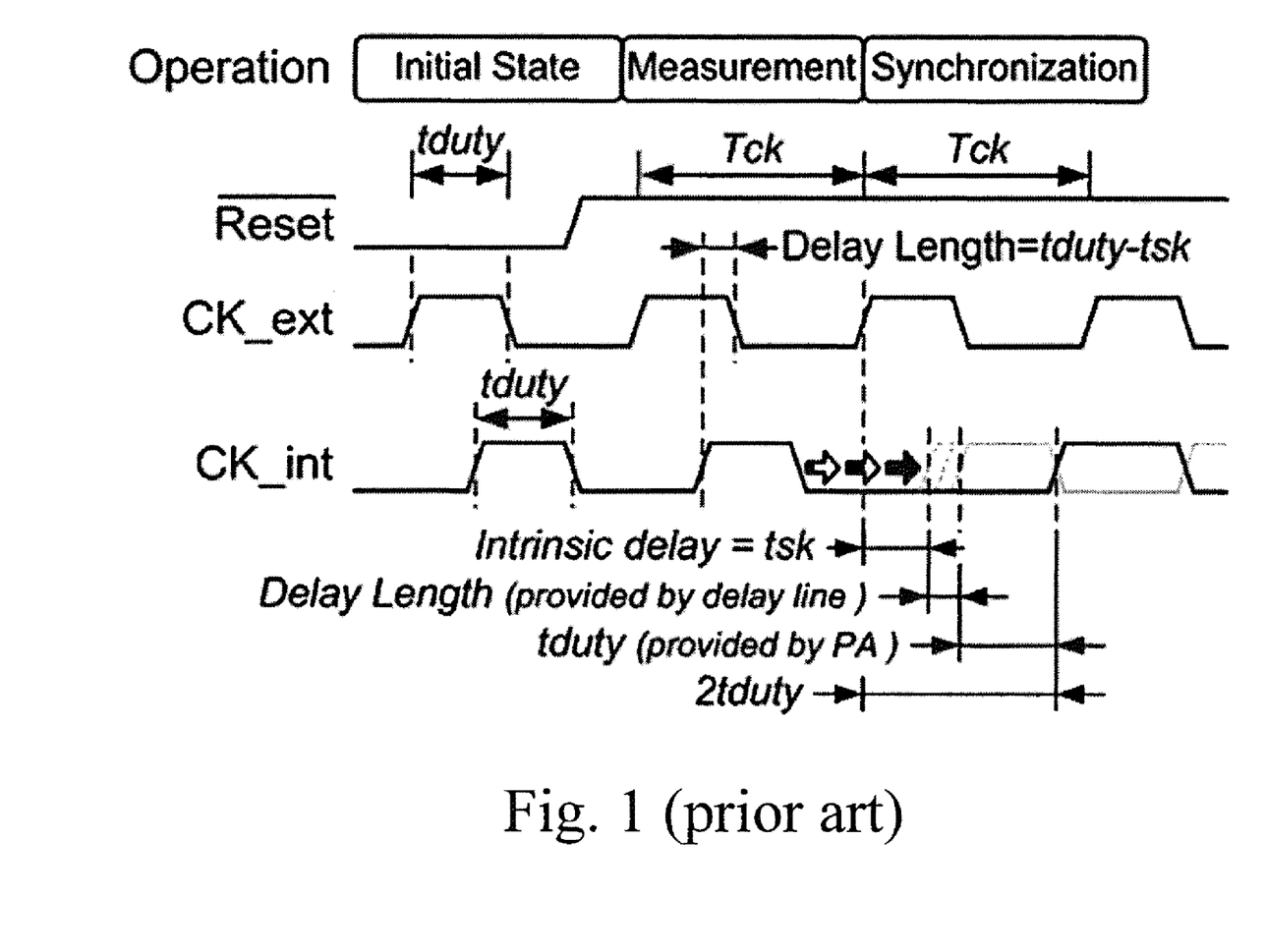
FIG. 1 is a timing diagram of a prior art.

In order to reduce power consumption, the half-delay-line de-skewing circuit (HDSC) has been developed and the circuit demands an input clock signal with a 50% duty cycle. This can be a difficult requirement because the system clock of a SoC needs to go through a large distribution network to arrive at the input terminal of the DLL, and as a consequence the duty cycle could be seriously distorted from 50%. Our analysis found that the HDSC fails to align with the clock phase if during the measurement phase, the rising edge of CK_int falls inside the pulse of CK_ext, refer to FIG. 1. After the intended delay is detected, the HDSC begins to adjust the rising edge of CK_int. However, since the phase adjuster inverts its input signal, the effective delay time becomes two times of the positive half cycle of the external clock signal CK_ext (tduty). Thus, such design is not suitable for the system in which the duty cycle of the external clock signal is not 50% and the applications of the circuit will be limited significantly.

There is a need to provide a new design of clock de-skewing delay locked loop circuit that is applied to systems in which the duty cycle of the external clock signal is not 50%. The clock de-skewing delay locked loop circuit has more applications.

SUMMARY OF THE INVENTION

Therefore, it is a primary object of the present invention to provide a de-skewing delay locked loop circuit that includes an inverting buffer circuit for increasing an initial delay time and causing a duty cycle of an internal clock signal and that of an external clock signal complementary to each other so as to synchronize the internal clock signal with the external clock signal. Thus the duty cycle of the external clock signal in the proposed circuit is not necessarily 50%.

In order to achieve the above object, the clock de-skewing delay locked loop circuit consists of a timing control circuit, a clock delay line, a delay mirror circuit, a phase adjustment circuit, and an inverting buffer circuit. The timing control circuit generates a first clock signal and a second clock signal according to an external clock signal and an internal clock signal separately. The clock delay line delays the first clock signal or the external clock signal to generate a plurality of delay signals. The delay mirror circuit generates the control codes of the clock delay line that delays the first clock signal or the external clock signal. The delay mirror circuit also stops receiving the delay signals and converts the delay signals to a delay data according to the second clock signal. In accordance with the delay data, a phase difference between the first clock signal and the second clock signal is obtained for synchronization of the internal clock signal with the external clock signal. In accordance with the phase difference, the phase adjustment circuit checks whether the phase of the internal clock signal is inverted. The inverting buffer circuit buffers the external clock signal or the first clock signal and adds an initial delay time so as to make a duty cycle of the internal clock signal and a duty cycle of the external clock signal complement each other for synchronization of the internal clock signal with the external clock signal. Thus the duty cycle of the external clock signal is not necessarily 50%.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 2:
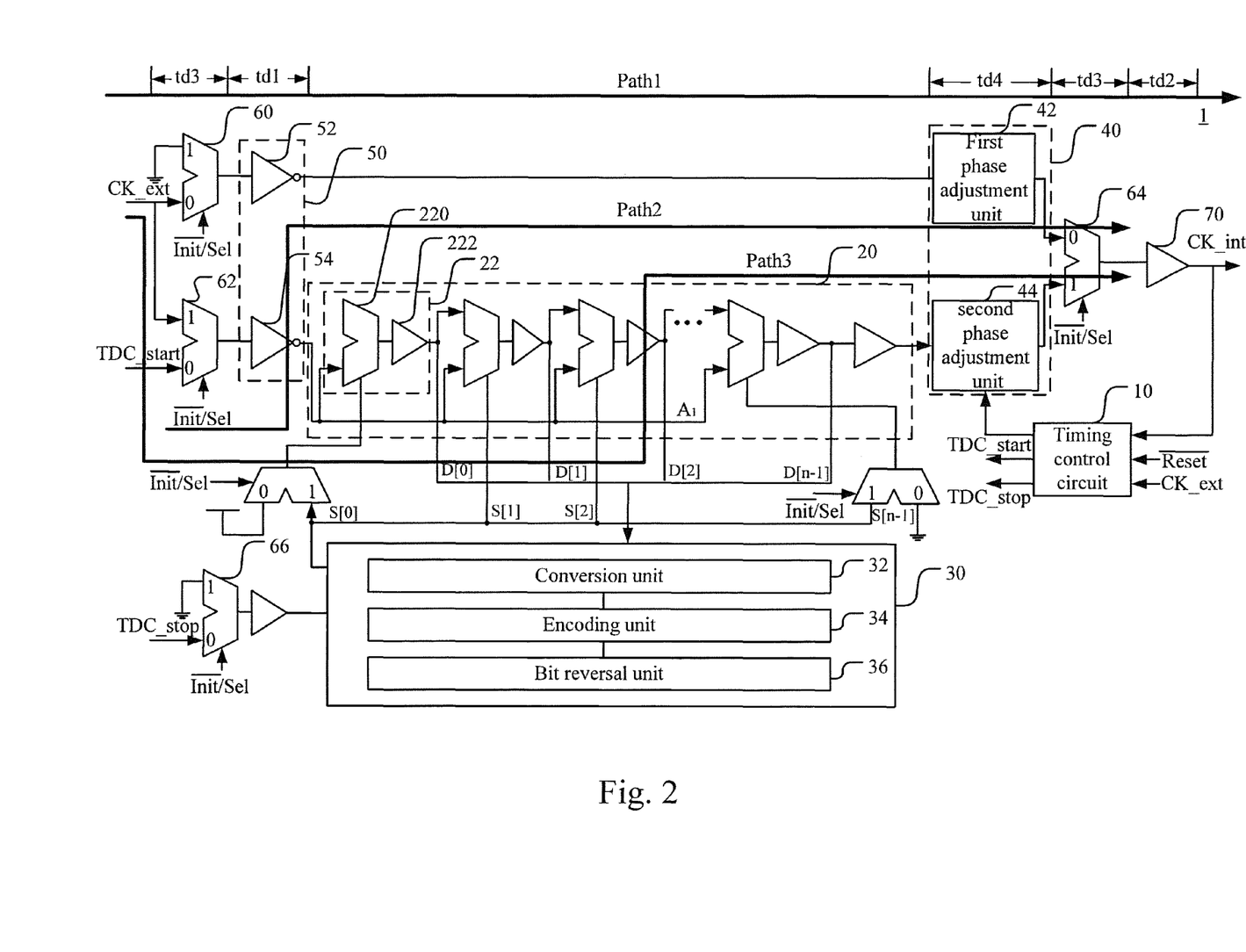
FIG. 2 is a circuit diagram of an embodiment of a delay locked loop according to the present invention.

Refer to FIG. 2, a circuit diagram of an embodiment according to the present invention is disclosed. A de-skewing delay locked loop circuit 1 of the present invention includes a timing control circuit 10, a clock delay line 20, a delay mirror circuit 30, a phase adjustment circuit 40 and an inverting buffer circuit 50. According to an internal clock signal CK_int and an external clock signal CK_ext, the timing control circuit 10 generates a first clock signal TDC_start and a second clock signal TDC_stop. The clock delay line 20 delays the first clock signal TDC_start or the external clock signal CK_ext to generate a plurality of delay signals D[0]~D[n-1]. As to the delay mirror circuit 30, it generates at least one delay selection signal for control of the clock delay line 20 that delays the first clock signal TDC_start or the external clock signal CK_ext. The delay mirror circuit 30 also stops receiving the delay signals and converts the delay signals into a delay data according to the second clock signal TDC_stop. In accordance with the delay data, the delay mirror circuit 30 obtains a phase difference between the first clock signal TDC_start and the second clock signal TDC_stop so as to synchronize the internal clock signal CK_int with the external clock signal CK_ext.

The phase adjustment circuit 40 is used for inverting the phase of the internal clock signal CK_int according to the phase difference between the internal clock and the external clock. That means the phase adjustment circuit 40 checks whether the phase of the internal clock signal CK_int is inverted or not according to the phase difference. Once the phase difference is larger than 180 degrees, the phase of the internal clock signal CK_int is inverted by the phase adjustment circuit 40. The inverting buffer circuit 50 buffers the external clock signal CK_ext or the first clock signal TDC_start and adds an initial delay time to make the duty cycle of the internal clock signal CK_int and the duty cycle of the external clock signal CK_ext complement each other. Thus by the inverting buffer circuit 50, an initial delay time is added, the duty cycle of the internal clock signal CK_int and the duty cycle of the external clock signal CK_ext complement each other . Therefore, the duty cycle of the external clock signal CK_ext in the proposed circuit is not necessary 50%.

In this embodiment, the inverting buffer circuit 50 is disposed before the phase adjustment circuit 40 so as to add the initial delay time. The inverting buffer circuit 50 can also be arranged after the phase adjustment circuit 40 and having the same function to provide the initial delay time.

The inverting buffer circuit 50 of the delay locked loop circuit 1 of the present invention consists of a first buffer unit 52 and a second buffer unit 54. The phase adjustment circuit 40 is composed of a first phase adjustment unit 42 and a second phase adjustment unit 44. According to a selection signal Init/Sel, the first buffer unit 52 buffers the external clock signal CK_ext to increase the initial delay time so as to make the duty cycle of the internal clock signal CK_int and the duty cycle of the external clock signal CK_ext complementary to each other. The second buffer unit 54 delays the first clock signal TDC_start or the external clock signal CK_ext according to a selection signal, Init/Sel. The first phase adjustment unit 42 corresponding to the first buffer unit 52 is for adjusting the phase of the external clock signal CK_ext. The second phase adjustment unit 44 corresponding to the second buffer unit 54 is for changing the phase of the internal clock signal CK_int inversely according to the phase difference between the first clock signal TDC_start and the second clock signal TDC_stop. In this embodiment, the first phase adjustment unit 42 is a dummy phase adjuster (DPA) and the second phase adjustment unit 44 is a phase adjuster (PA).

Moreover, the delay locked loop circuit 1 of the present invention includes a first select unit 60, a second select unit 62, a third select unit 64 and a fourth select unit 66. These select units of the present invention are used to switch the operation mode of the delay locked loop circuit 1. The first select unit 60 outputs the external clock signal CK_ext to the first buffer unit 52 according to the selection signal Init/Sel while the second select unit 62 outputs the first clock signal TDC_start or the external clock signal CK_ext to the second buffer unit 54 according to the selection signal Init/Sel. Similarly, in accordance with the selection signal Init/Sel, the third select unit 64 outputs signals from the first phase adjustment unit 42 or the second phase adjustment unit 44 while the fourth select unit 66 outputs the second clock signal TDC_stop to the delay mirror circuit 30.

Furthermore, the delay locked loop circuit 1 also includes an output driver 70 that is coupled to an output end of the delay locked loop circuit 1 and used for driving and outputting the internal clock signal CK_int generated by the delay locked loop circuit 1.

Figure 3:
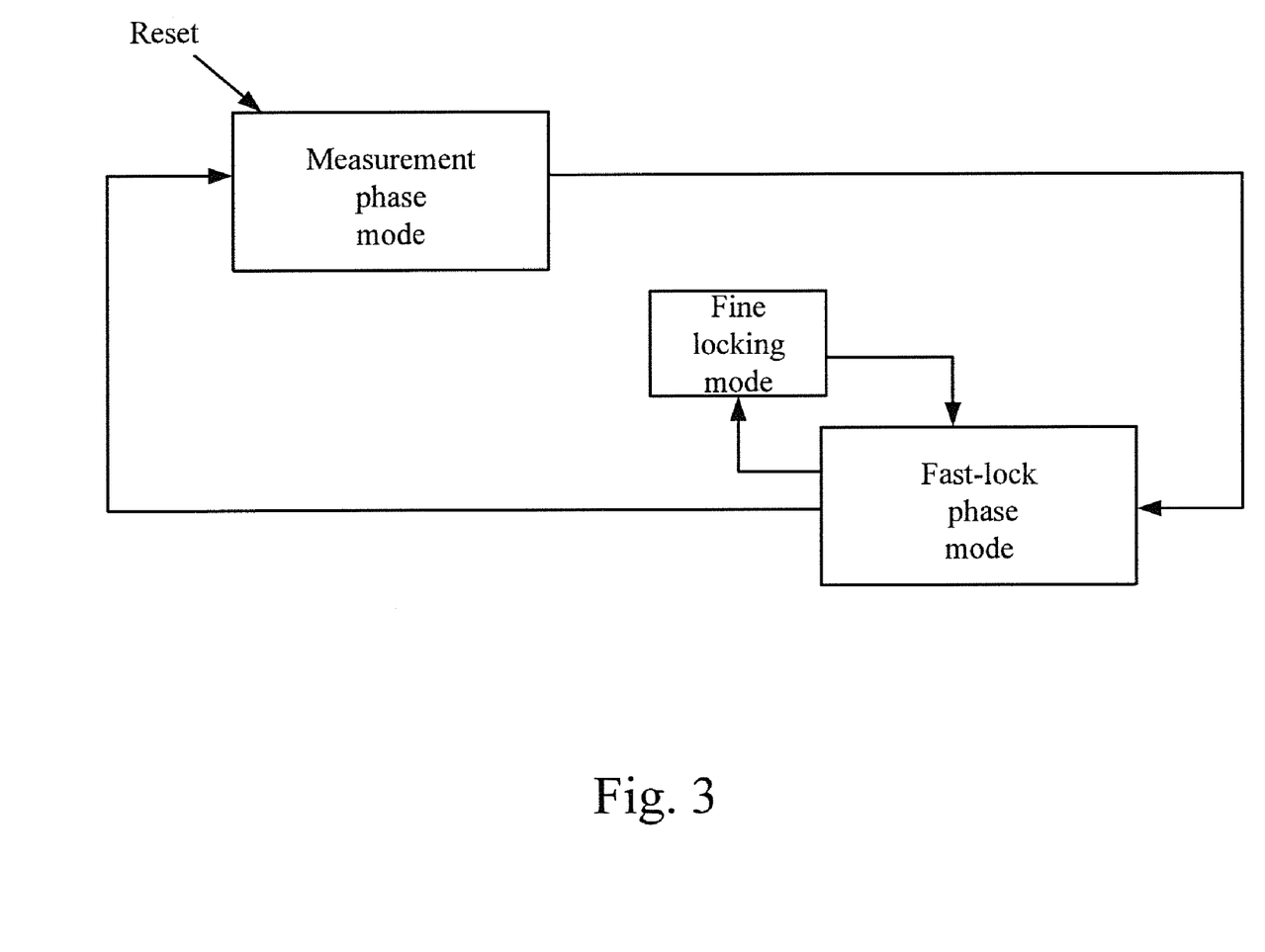
FIG. 3 is a schematic drawing showing the operating modes of an embodiment of a delay locked loop according to the present invention.
Figure 4:
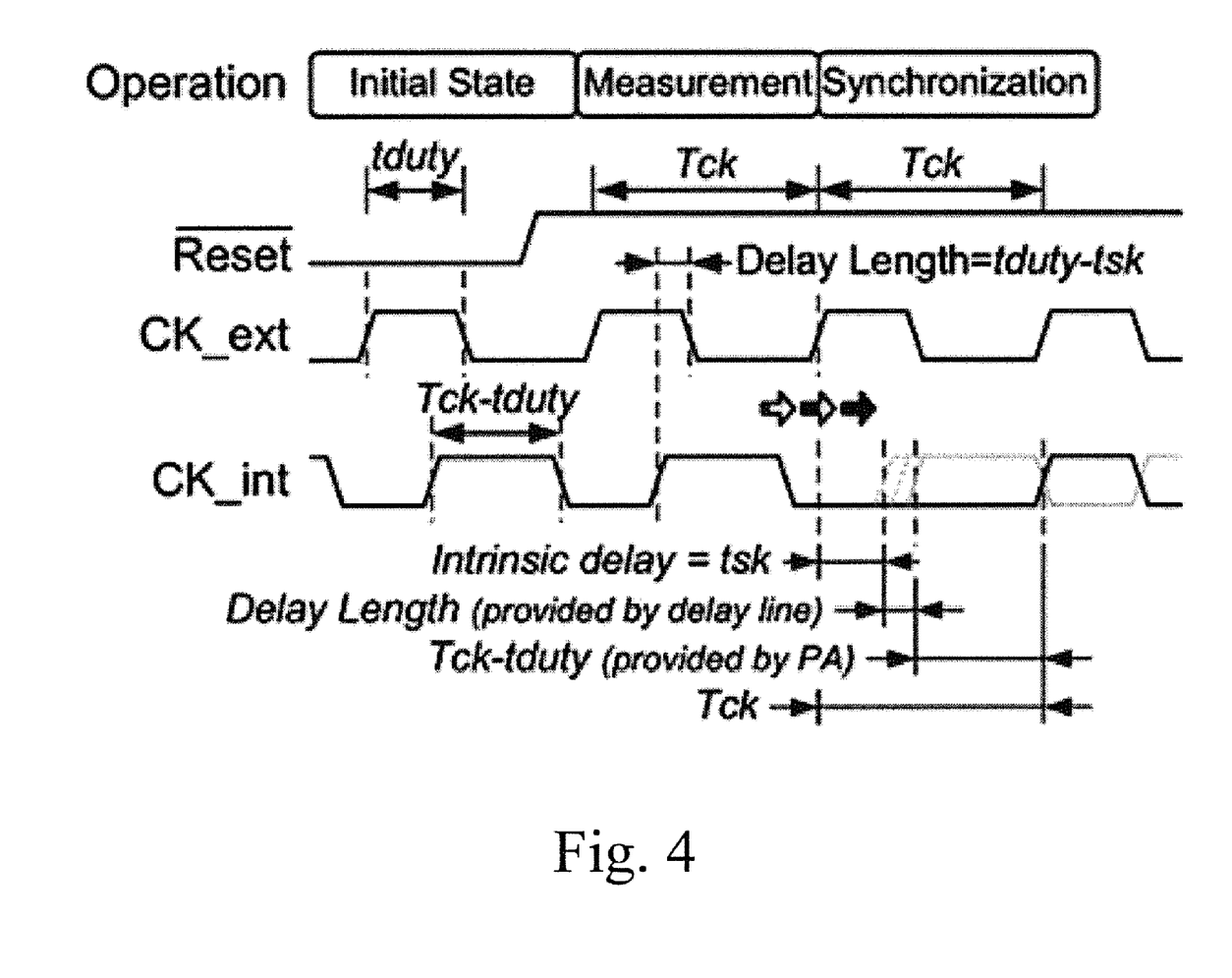
FIG. 4 is a timing diagram of an embodiment of a delay locked loop according to the present invention.

This embodiment of the clock de-skewing delay locked loop circuit 1 has two operation modes. As shown in FIG. 3, the delay locked loop circuit 1 provides a measurement phase mode and a fast-lock phase mode. After the delay locked loop circuit 1 being reset, it enters the measurement phase mode and the fast-lock phase mode in turn and synchronizes the internal clock signal CK_int with the external clock signal CK_ext. Refer to FIG. 4, a timing diagram of an embodiment is revealed. By the inverting buffer circuit 50, the duty cycle of the external clock signal CK_ext and the duty cycle of the internal clock signal CK_int are complementary to each other. The total time of the delay time includes the delay time provided by the phase adjustment circuit 40 (=Tck−tduty), the intrinsic delay of the circuit (=tsk), and the delay length (=tduty−tsk) and it is equal to the duty cycle of the clock signal Tck. Thus the present invention uses the inverting buffer circuit 50 to increase the initial delay time and make the external clock signal CK_ext and the internal clock signal CK_int complement each other. Then a proper delay time is obtained by the timing control circuit 10 so as to achieve clock lock-in. Thus the circuit can be applied to systems in which the duty cycle of the external clock signal CK_ext is not 50%.

Figure 5A:
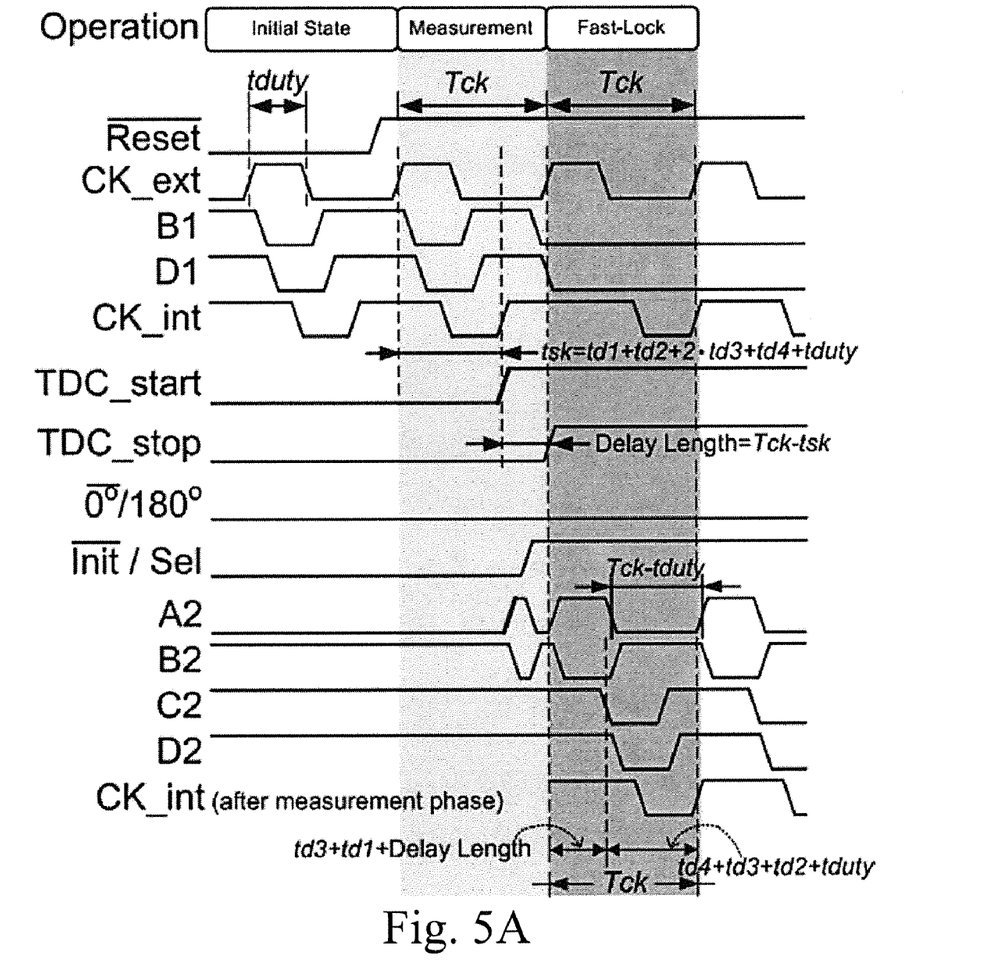
FIG. 5A is a timing diagram of an embodiment of a delay locked loop according to the present invention.

The detailed operations of the delay locked loop circuit 1 are described in the following. Refer to FIG. 5A, in this embodiment, a rising edge of the internal clock signal CK_int falls outside the pulse of CK_ext. When the delay locked loop circuit 1 starts the measurement phase, the selection signal Init/Sel is set low. The selection signal Init/sel is used to determine the delay locked loop circuit 1 in the initial state or in the state that the number of the delay cells has been set.

After the signal, Reset, is released, the external clock signal CK_ext passes through the first buffer unit 52, the first phase adjustment unit 42, and the output driver 70 and generate the internal clock signal CK_int, as the Path 1 shown in FIG. 2. Now initial delay time (the initial clock skew) tsk is equal to td1+td2+2td3+td4+tduty while td1+tduty is the processing time of the inverting buffer circuit 50, td2 is the processing time of the output driver 70, td3 is the processing time of each select unit 60, 62, 64, 66, and td4 is the processing time of the phase adjustment circuit 40. Due to the first buffer unit 52, the initial delay time is increased by tduty. Then the internal clock signal CK_int activates the timing control circuit 10 with a positive-edge-triggered flip-flop. The timing control circuit 10 generates the first clock signal TDC start from the positive edge of the internal clock signal CK_int. Next the second clock signal TDC_stop is triggered from the rising edge of the external clock signal CK_ext. Refer to FIG. 5A, it is learned clearly that the phase difference between the first clock signal TDC_start and the second clock signal TDC_stop is precisely the time difference between the clock cycle time and the clock skew. This time interval is exactly the delay length that the clock delay line 20 should provide.

Figure 5B:
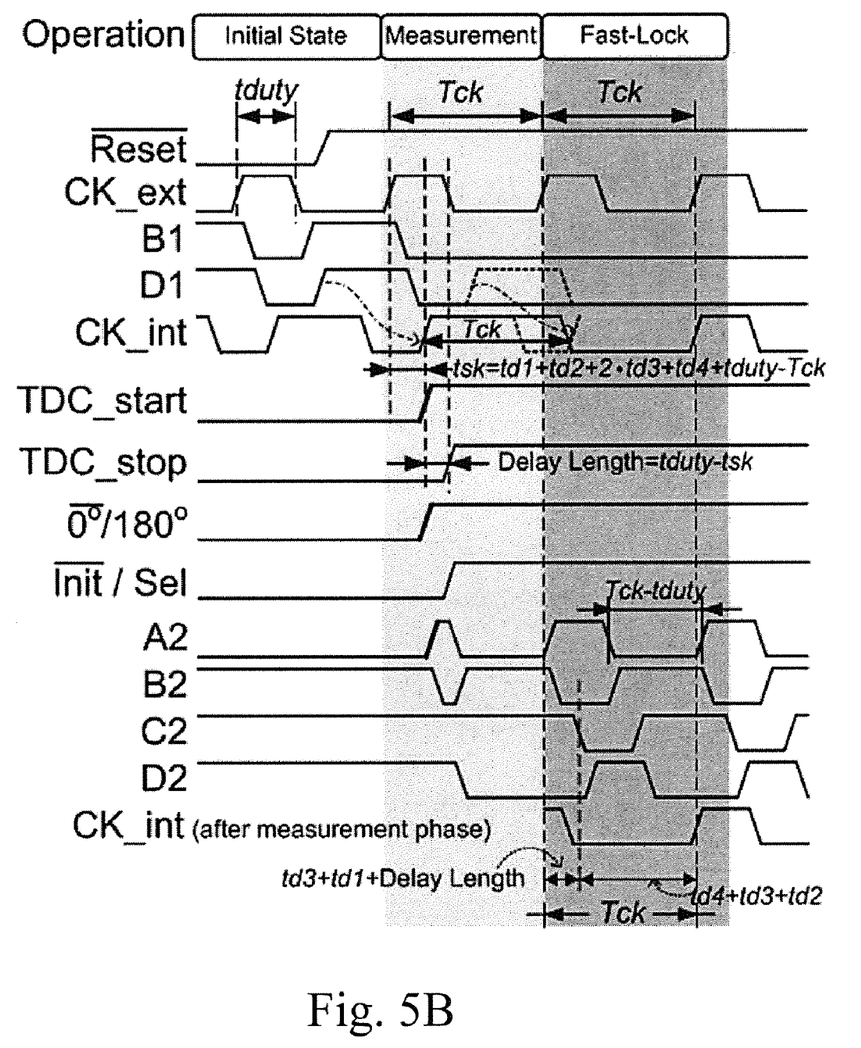
FIG. 5B is a timing diagram of another embodiment of a delay locked loop according to the present invention.

Once the initial delay time is larger than the period of the clock signal, the rising edge of the internal clock signal CK_int falls inside the pulse of the external clock signal CK_ext. As shown in FIG. 5B, there is no need to increase the time by the inverting buffer circuit 50 once the initial delay time is larger than the duty cycle of the clock signal. Thus in the present invention, the phase adjustment circuit 40 is used to invert the signal passing through the inverting buffer circuit 50, and the timing control circuit 10 generates the first clock signal TDC_start from the positive (rising) edge of the internal clock signal CK_int. Next the second clock signal TDC_stop is triggered from the falling edge of the external clock signal CK_ext. From the above embodiment, it is learned that the time interval between the first clock signal TDC_start and the second clock signal TDC_stop is tduty−(td1+td2+2td3+td4+tduty−Tck). Therefore, the total time of the delay length that the clock delay line 20 should provide and the intrinsic delay of the delay locked loop circuit (intrinsic delay=td1+td2+2td3+td4) is just equal to the duty cycle of the external clock signal CK_ext.

In the embodiments shown in FIG. 5A and FIG. 5B, the duty cycle of the external clock signal CK_ext is smaller than 50%. The delay locked loop circuit 1 of the present invention can also be applied to systems in which the duty cycle of the external clock signal CK_ext is larger than 50%. A person skilled in the art would find the related embodiment obviously through FIG. 5A and FIG. 5B.

Later the delay locked loop circuit 1 enters the fast-lock phase mode. The fast-lock phase mode is used to convert the time interval between the first clock signal TDC_start and the second clock signal TDC_stop into the delay length required to be provided by the clock delay line 20 so that the internal clock signal CK_int gets locked to the external clock signal CK_ext.

Furthermore, the clock delay line 20 is composed of a plurality of delay cells 22. Each delay cell 22 includes a fifth select unit 220 and a delay unit 222. According to the delay selection signals S[0]~S[n−1], the fifth select unit 220 selects the clock signal, A1, or the output from the delay cell 22 at a previous level. The delay unit 222 coupled to the fifth select unit 220 is for delaying the clock signal, A1, or the output from the delay cell 22 at a previous level. When the delay locked loop circuit 1 is in the measurement phase mode, the external clock signal CK_ext firstly passes through the first select unit 60, the first buffer unit 52, the first phase adjustment unit 42, the third select unit 64 and the output driver 70 so as to produce the internal clock signal CK_int (Path 1).

Then the timing control circuit 10 generates the first clock signal TDC_start and the second clock signal TDC_stop according to the external clock signal CK_ext and the internal clock signal CK_int, and controls the first select unit 60, the second select unit 62 and the third select unit 64. The timing control circuit 10 generates the selection signal $\overline{\text{Init}}$/sel for control and selection of the first select unit 60, the second select unit 62 and the third select unit 64. Thus the first clock signal TDC_start passes though the second select unit 62, the second buffer unit 54, the clock delay line 20, the second phase adjustment unit 44, and the third select unit 64 to be sent to the output driver 70 (Path 2). Now the timing control circuit 10 generates and sends the second clock signal TDC_stop to the delay mirror circuit 30. After receiving the second clock signal TDC_stop, the delay mirror circuit 30 converts delay signals from the clock delay line 20 into a delay data. The number of the delay cells 22 can be obtained through the delay data because the delay data is generated according to the delay signals D[0]~D[n−1] respectively output from an output end of each delay cell 22 and passing through the delay mirror circuit 30.

Finally, the selection signal $\overline{\text{Init}}$/sel set at high level is for control of the select units 60, 62, 64, 66 so that the external clock signal CK_ext passes though the second select unit 62, the second buffer unit 54, the clock delay line 20, the second phase adjustment unit 44, the third select unit 64 and the output driver 70 to generate the internal clock signal CK_int (Path 3) and synchronize the internal clock signal CK_int with the external clock signal CK_ext.

Figure 6:
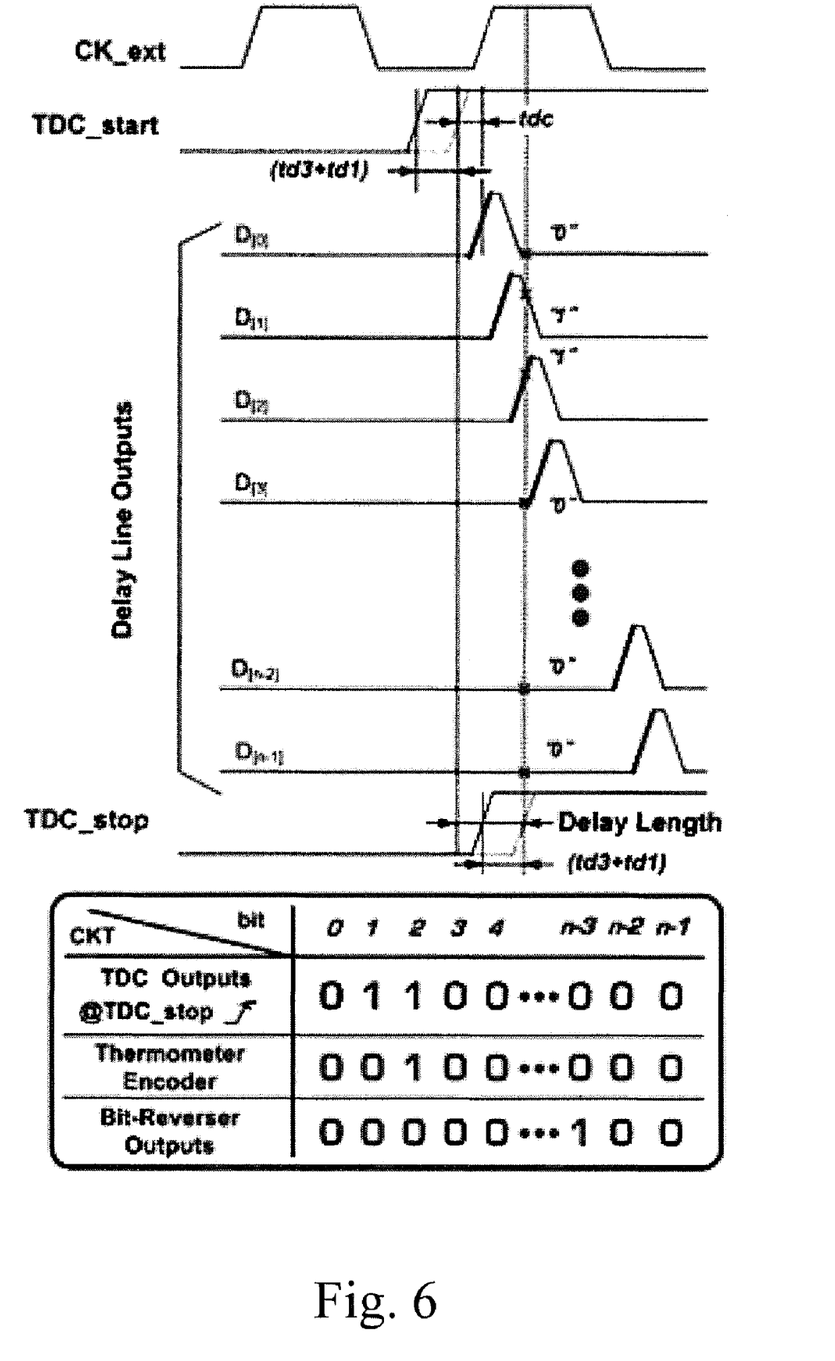
FIG. 6 is a schematic drawing showing the signals of a delay mirror circuit of an embodiment according to the present invention.

Refer to FIG. 6, a schematic drawing showing signals of the delay mirror circuit of an embodiment according to the present invention is revealed. As shown in FIG. 2, the delay mirror circuit 30 consists of a conversion unit 32, an encoding unit 34 and a bit reversal unit 36. The conversion unit 32 receives and converts the delay signals into the delay data. When the second clock signal TDC_stop changes from low level to high level, the conversion unit 32 quantifies and retrieves the last output signal of the clock delay line 20. Then the conversion unit 32 sends the delay data to the encoding unit 34. The encoding unit 34 receives and encodes the delay data so as to generate an encoded data. In this embodiment, the encoding unit 34 is a thermometer encoder used to find the position of the rightmost "1" from the delay data and form the encoded data. The bit reversal unit 36 receives the encoded data and inverts positions of bits of the encoded data in a bit sequence.

The bit reversal unit 36 is a bit-reverser reverses the order of bits of the encoded data and outputs the values to the clock delay line 20. That means the delay mirror circuit 30 generates delay selection signals according to the encoded data with inverted bit sequence. Through the encoded data, the delay mirror circuit 30 obtains the number of the required delay cells 22 of the clock delay line 20 and generates the desired delay selection signal to the clock delay line 20.

Figure 7:
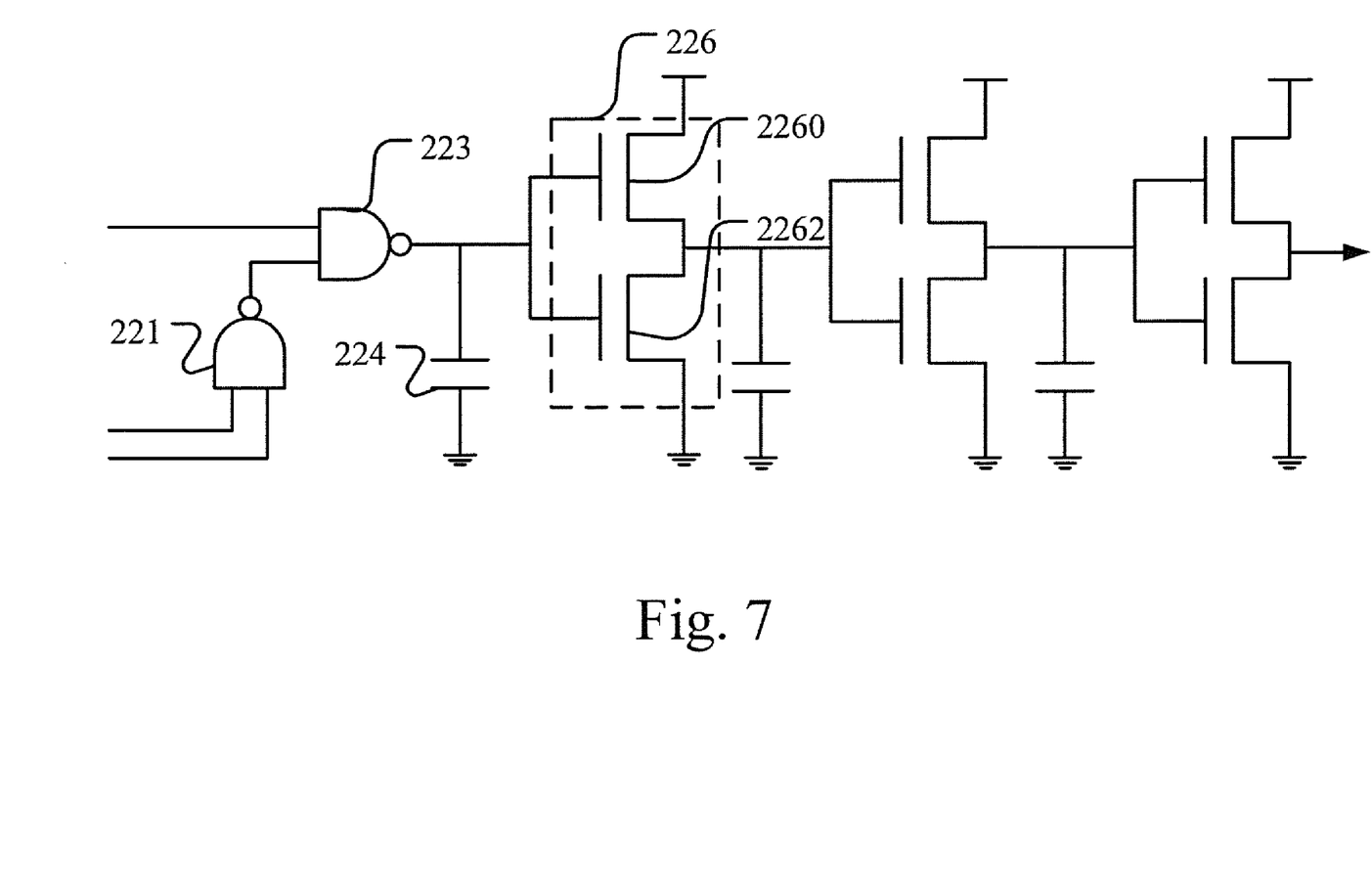
FIG. 7 is circuit diagram of delay cell of an embodiment according to the present invention.

Refer to FIG. 7, a circuit diagram of a delay cell of an embodiment according to the present invention is disclosed. The delay cell 22 includes a first NAND gate 221, a second NAND gate 223, a capacitor 224 and a delay unit 226. The first NAND gate 221 consists of a first input end, a second input end and an output end. The first input end receives the clock signal, A1, while the second input end is for receiving the delay selection signals S[1]~S[n−1]. The second NAND gate 223 has a first input end, a second input end and an output end. The first input end of the second NAND gate 223 is coupled to the output end of the first NAND gate 221 while the second input end of the second NAND gate 223 is coupled to the output end of the delay cell 22 at a previous level. The capacitor 224 is coupled to the output end of the second NAND gate 223 and the delay unit 226 is coupled to both the output end of the second NAND gate 223 and the capacitor 224.

The delay unit 226 includes a first transistor 2260 and a second transistor 2262. The first transistor 2260 consists of a gate, a drain and a source. The gate is coupled to the second NAND gate 223 and the capacitor 224 while the source is connected to a power source. The second transistor 2262 consists of a gate, a drain and a source. The gate of the second transistor 2262 is coupled to the second NAND gate 223 and the capacitor 224. The drain of the second transistor 2262 is coupled to the drain of the first transistor 2260. The source of the second transistor 2262 is coupled to a ground terminal. Moreover, the delay unit 226 can be coupled to a plurality of first transistors 2260 and a plurality of second transistors 2262 according to the required delay time.

Figure 8:
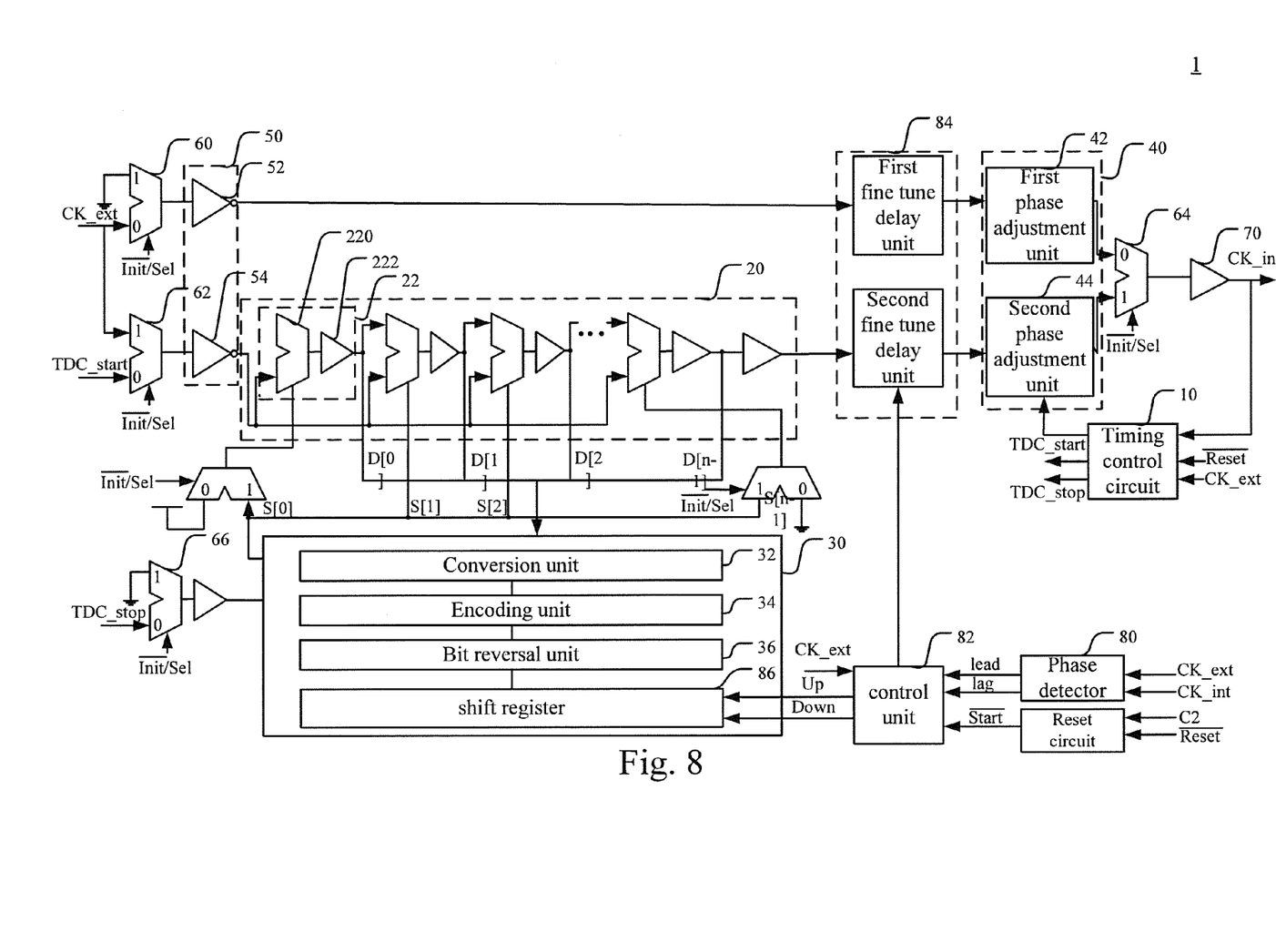
FIG. 8 is a circuit diagram of another embodiment of a delay locked loop according to the present invention.
Figure 9:
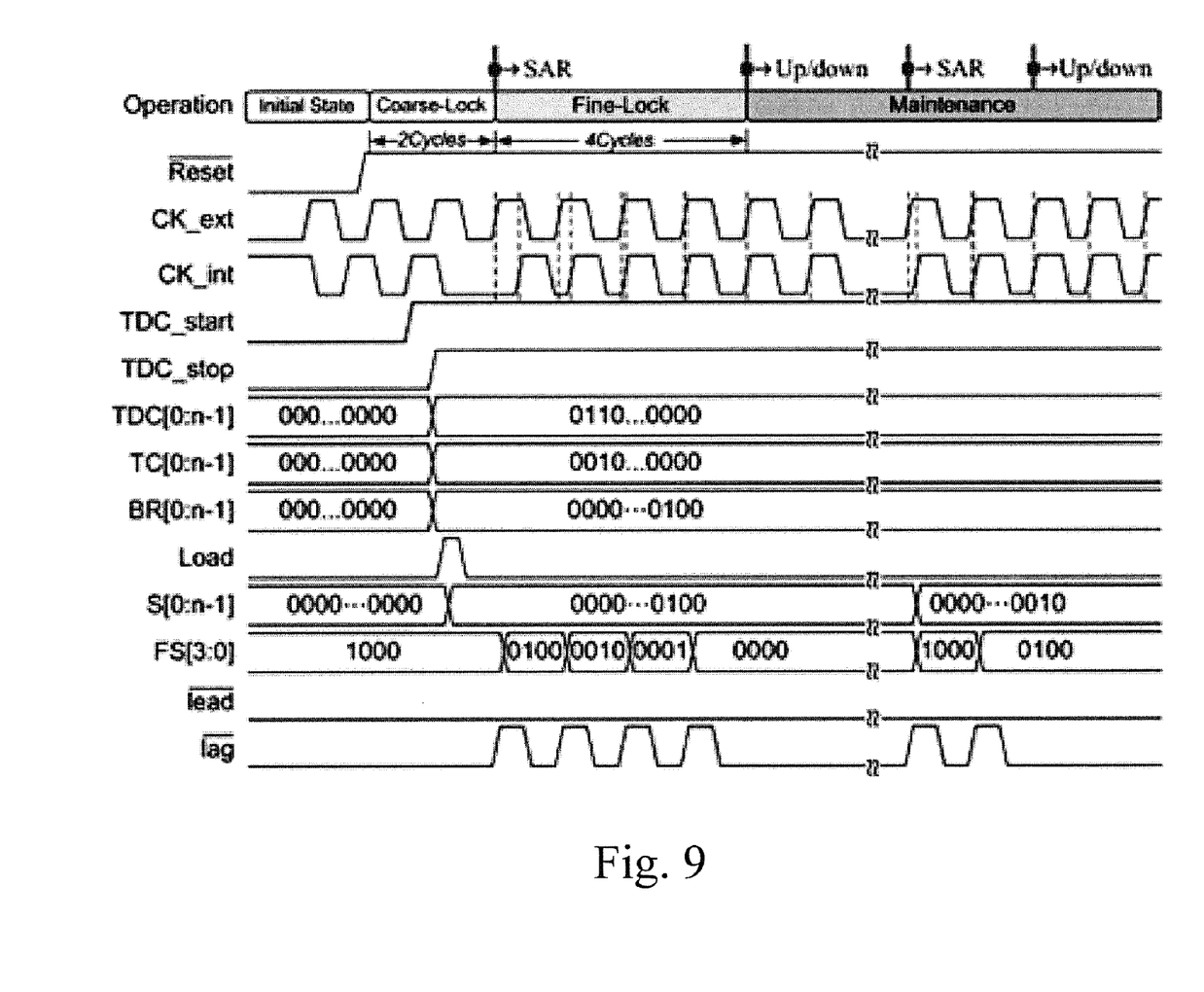
FIG. 9 is a timing diagram of the embodiment in FIG. 8.

Refer to FIG. 8 and FIG. 9, a circuit diagram and a timing diagram of another embodiment of the present invention are revealed. The difference between this embodiment and the one in FIG. 2 is in that the delay locked loop circuit 1 further includes a phase detector 80, a control unit 82 and a fine tune delay circuit 84. The phase detector 80 detects phase difference between the external clock signal CK_ext and the internal clock signal CK_int and generates a detection signal. The control unit 82 receives the detection signal and generates a control signal according to the received detection signal. According to the control signal, the fine tune delay circuit 84 adjusts the delay signal output from the clock delay line 20 finely. After the coarse adjustment of the delay control of the clock delay line 20 by the delay locked loop circuit 1 (the measurement phase mode and the fast-lock phase mode mentioned-above), general lock-in in open loop has been finished. Then the device enters a fine locking mode. Now in the circuit, phase difference between the external clock signal CK_ext and the internal clock signal CK_int is detected by the phase detector 80 and the output provided by the phase detector 80 will transfer to the control unit 82. After receiving the signal of phase difference, the control unit 82 generates and sends the control signal to the fine tune delay circuit 84 for fine adjustment. This means the phases of the two signals are locked. After this operation, the phase detector 80 will continue to detect the phase difference and the delay locked loop circuit 1 will not start working again until the phases between CK_ext and CK_int are not locked due to the environment variations.

In addition, the delay locked loop circuit 1 includes a shift register 86. The shift register 86 controls the delay selection signals from the delay mirror circuit 30 according to the control signal. In this embodiment, the shift register 86 is disposed on the delay mirror circuit 30 so as to control the delay selection signals S[1]~S[n-1] generated by the delay mirror circuit 30 in accordance with the control signal. After completing the fine locking mode, the delay locked loop circuit 1 enters a maintenance mode. The phase detector 80 continues to detect the phase relationship between the external clock signal CK_ext and the internal clock signal CK_int and properly adjust the phase difference between the external clock signal CK_ext and the internal clock signal CK_int. Once the phase error between CK_ext and CK_int in the delay locked loop circuit 1 is quite large due to influence of voltage or temperature, the fine tune delay circuit 84 is unable to adjust the phase of the external clock signal CK_ext and synchronize the internal clock signal with the external clock signal. Under such condition, the control unit 82 sends the control signal to the shift register 86 for coarse adjustment of the clock delay line 20. The control signal generated by the control unit 82 includes an increasing signal Up and a decreasing signal Down. If the increasing signal Up is at high level, this represents the delay needs to be increased and the shift register 86 shifts the delay data to the left side. On the other hand, once the decreasing signal Down is at high level, this means the delay should be reduced and the shift register 86 shifts the delay data to the right side.

In summary, a de-skewing delay locked loop circuit of the present invention includes a timing control circuit, a clock delay line, a delay mirror, circuit, a phase adjustment circuit, and an inverting buffer circuit. The timing control circuit generates a first clock signal and a second clock signal according to an external clock signal and an internal clock signal. The clock delay line for delaying the first clock signal or the external clock signal generates a plurality of delay signals. The delay mirror circuit is used to generate a delay selection signal for control of the clock delay line that delays the first clock signal or the external clock signal. The delay mirror circuit also stops receiving the delay signals and converts the delay signals to a delay data according to the second clock signal. In accordance with the delay data, a phase difference between the first clock signal and the second clock signal is obtained so as to synchronize the internal clock signal with the external clock signal. The phase adjustment circuit is for inverting the phase of the internal clock signal. The inverting buffer circuit buffers the external clock signal or the first clock signal to add an initial delay time so that the duty cycle of the internal clock signal and the duty cycle of the external clock signal are complementary to each other. And the internal clock signal and the external clock signal are synchronized with each other. Therefore, the duty cycle of the external clock signal is not necessarily 50%.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A clock de-skewing delay locked loop circuit comprising:
   a timing control circuit that generates a first clock signal and a second clock signal according to an internal clock signal and an external clock signal;
   a clock delay line that delays the first clock signal or the external clock signal to generate a plurality of delay signals;
   a delay mirror circuit that generates at least one delay selection signal to control the clock delay line, stops receiving the delay signals and converts the delay signals to a delay data according to the second clock signal, obtains a phase difference between the first clock signal and the second clock signal according to the delay data, and controls the clock delay line for synchronizing the internal clock signal with the external clock signal;
   a phase adjustment circuit that inverts the phase of the internal clock signal CK_int according to the phase difference between the external clock and the internal clock; and
   an inverting buffer circuit that buffers the external clock signal or the first clock signal to increase an initial delay time and make a duty cycle of the internal clock signal and a duty cycle of the external clock signal complement each other.

2. The device as claimed in claim 1, wherein the duty cycle of the external clock signal is not 50%.

3. The device as claimed in claim 1, wherein the inverting buffer circuit includes:
   a first buffer unit that buffers the external clock signal according to a selection signal and adds an initial delay time to make the duty cycle of the internal clock signal and the duty cycle of the external clock signal complement each other; and
   a second buffer unit delays the first clock signal or the external clock signal according to the selection signal.

4. The device as claimed in claim 3, wherein the phase adjustment circuit includes:
   a first phase adjustment unit that is corresponding to the first buffer unit and is for adjusting the phase of the external clock signal; and a second phase adjustment unit that is corresponding to the second buffer unit and is used for inverting the phase of the internal clock signal according to the phase difference.

5. The device as claimed in claim 3, wherein the clock de-skewing delay locked loop circuit further includes:
   a first select unit that outputs the external clock signal to the first buffer unit according to the selection signal;
   a second select unit that outputs the first clock signal or the external clock signal to the second buffer unit according to the selection signal; and
   a third select unit that outputs signals from the first phase adjustment unit or the second phase adjustment unit according to the select signal.

6. The device as claimed in claim 1, wherein the clock delay line includes a plurality of delay cells and each of the delay cells having:
   a select unit that selects the clock signal, A1, or the output from the delay cell at a previous level according to the delay selection signals; and
   a delay unit that is coupled to the select unit and is used for delaying the external clock signal or the first clock signal.

7. The device as claimed in claim 1, wherein the clock delay line includes a plurality of delay cells and each of the delay cells includes:
   a first NAND gate having a first input end, a second input end and an output end; the first input end receiving the clock signal, A1, while the second input end receiving the delay selection signal;
   a second NAND gate having a first input end, a second input end and an output end; the first input end of the second NAND gate coupled to the output end of the first NAND gate while the second input end of the second NAND gate is coupled to the output end of the delay cell at a previous level;
   a capacitor that is coupled to the output end of the second NAND gate; and
   a delay unit that is coupled to both the second NAND gate and the capacitor.

8. The device as claimed in claim 7, wherein the delay unit includes:
   a first transistor having a gate, a drain and a source; the gate is coupled to the second NAND gate and the capacitor while the source is connected to a power source; and
   a second transistor having a gate, a drain and a source; the gate of the second transistor is coupled to the second NAND gate and the capacitor; the drain of the second transistor is coupled to the drain of the first transistor; the source of the second transistor is coupled to a ground terminal.

9. The device as claimed in claim 1, wherein the delay mirror circuit includes:
   a conversion unit that receives the delay signals and converts the delay signals into the delay data;
   an encoding unit that receives and encodes the delay data so as to generate an encoded data; and
   a bit reversal unit that receives the encoded data and inverts positions of bits of the encoded data in a bit sequence;
   wherein the delay mirror circuit generates the delay selection signal according to the encoded data with inverted bit sequence.

10. The device as claimed in claim 1, wherein the clock de-skewing delay locked loop circuit further includes:
    a phase detector that detects phase difference between the external clock signal and the internal clock signal and generates a detection signal;
    a control unit that generates a control signal according to the detection signal; and
    a fine tune delay circuit that adjusts the delay signal output from the clock delay line finely according to the control signal.

11. The device as claimed in claim 1, wherein the clock de-skewing delay locked loop circuit further includes:
    a phase detector that detects phase difference between the external clock signal and the internal clock signal and generates a detection signal;
    a control unit that generates a control signal according to the detection signal; and
    a shift register that is used to control the delay mirror circuit that generates the delay selection signal according to the control signal.

12. The device as claimed in claim 1, wherein the clock de-skewing delay locked loop circuit further includes:
    a phase detector that detects phase difference between the external clock signal and the internal clock signal and generates a detection signal;
    a control unit that generates a control signal according to the detection signal;
    a fine tune delay circuit that adjusts the delay signal output from the clock delay line finely according to the control signal; and
    a shift register that is used to control the delay mirror circuit that generates the delay selection signal according to the control signal.

* * * * *